United States Patent
Lo et al.

(10) Patent No.: US 8,728,235 B2
(45) Date of Patent: May 20, 2014

(54) MANUFACTURING METHOD FOR THREE-DIMENSIONAL GAN EPITAXIAL STRUCTURE

(75) Inventors: I-Kai Lo, Kaohsiung (TW); Chia-Ho Hsieh, Kaohsiung (TW); Yu-Chi Hsu, Kaohsiung (TW); Wen-Yuan Pang, Kaohsiung (TW); Ming-Chi Chou, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 469 days.

(21) Appl. No.: 12/568,291

(22) Filed: Sep. 28, 2009

(65) Prior Publication Data

US 2010/0229788 A1  Sep. 16, 2010

(30) Foreign Application Priority Data

Mar. 11, 2009 (TW) .............................. 098107912 A (51) Int. Cl.
*C30B 25/18* (2006.01)
(52) U.S. Cl.
CPC ..................................... *C30B 25/18* (2013.01)
USPC ............... 117/87; 117/84; 117/105; 117/106; 117/108; 117/204; 117/205
(58) Field of Classification Search
CPC ........ C30B 23/00; C30B 29/00; C30B 29/10; C30B 29/40; C30B 29/403; C30B 29/406; C30B 25/00; C30B 25/02; C30B 25/18; C30B 29/60; C30B 29/605
USPC ............. 117/84, 87, 105, 106, 108, 204, 205, 117/902, 921, 923, 924, 952
See application file for complete search history.

(56) References Cited

U.S. PATENT DOCUMENTS

| 5,290,393 A | 3/1994 | Nakamura |
| 5,385,862 A * | 1/1995 | Moustakas .................... 117/108 |
| 6,252,261 B1 | 6/2001 | Usui et al. |
| 6,692,568 B2 * | 2/2004 | Cuomo et al. .................. 117/84 |
| 6,809,351 B2 | 10/2004 | Kuramoto et al. |
| 2009/0114887 A1 * | 5/2009 | Kent et al. .................. 252/521.5 |

FOREIGN PATENT DOCUMENTS

| TW | I308552 | 4/2003 |
| TW | I300632 | 5/2006 |

OTHER PUBLICATIONS

I. Lo, et al. publication entitled "Line defects of M-plane GaN grown on gamma-LiAlO2 by plasma-assisted molecular beam epitaxy," Appl. Phys. Lett. 92, 202106 (2008).*

(Continued)

*Primary Examiner* — Michael Kornakov
*Assistant Examiner* — Kenneth A Bratland, Jr.
(74) *Attorney, Agent, or Firm* — Muncy, Geissler, Olds & Lowe, P.C.

(57) ABSTRACT

A manufacturing method for three-dimensional GaN epitaxial structure comprises a disposing step, in which a substrate of $LiAlO_2$ and a source metal of Ga are disposed inside an vacuum chamber. An exposing step is importing N ions in plasma state and generated by a nitrogen source into the chamber. A heating step is heating up the source metal to generate Ga vapor. A growing step is forming a three-dimensional GaN epitaxial structure with hexagonal micropyramid or hexagonal rod having a broadened disk-like surface on the substrate by reaction between the Ga vapor and the plasma state of N ions.

8 Claims, 7 Drawing Sheets

(56) References Cited

OTHER PUBLICATIONS

C-H. Hsieh, et al. publication entitled "Self-assembled c-plane GaN nanopillars on gamma-LiAlO2 substrate grown by plamsa-assisted molecular-beam epitaxy," Jpn. J. Appl. Phys. vol. 47, pp. 891-895, published online Feb. 15, 2008.*

I. Lo, et al. publication entitled "Line defects of M-plane GaN grown on gamma-LiAlO2 by plasma-assisted molecular beam epitaxy," Appl. Phys. Lett. 92, 202106, published online May 19, 2008.*

Tsai, et al. publication entitled "Effect of N to Ga flux ratio on the GaN surface morphologies grown at high temperature by plasma-assisted molecular beam epitaxy," J. Appl. Phys. vol. 95, pp. 460-465 (2003).*

Tun et al., "Growth and characterization of c-plane AlGaN on γ-LiAlO2," Journal of Crystal Growth, 311, May 5, 2009, pp. 3726-3730.

Lang et al., "NH3-rich growth of InGaN and InGaN/GaN superlattices by NH3-based molecular beam epitaxy," Journal of Crystal Growth, 346, Mar. 7, 2012, pp. 50-55.

* cited by examiner

MANUFACTURING METHOD FOR THREE-DIMENSIONAL GAN EPITAXIAL STRUCTURE

BACKGROUND OF THE INVENTION

1. Field of the Invention

The present invention relates to an epitaxial nano-structure and manufacturing method for growing epitaxy and, more particularly, to a three-dimensional GaN epitaxial structure and manufacturing method thereof.

2. Description of the Related Art

Conventional manufacturing method for growing Gallium nitride (GaN) structure is metal-organic chemical vapor deposition, MOCVD. For forming a thin film on a substrate through MOCVD method, a carrier gas such as hydrogen ($H_2$) or nitrogen ($N_2$) carries a saturated vapor, which is generated by a metal-organic source, to a chamber to mix with other gases and a chemical reaction is then taken place on a surface of the substrate with high temperature in the chamber, so that the thin film with large area is formed on the surface of the substrate by deposition. Namely, the thin film grows on the substrate gradually when the MOCVD method is processed.

In MOCVD, the carrier gases can be selected from hydrogen ($H_2$) or nitrogen ($N_2$). Materials of the substrate can be selected from Gallium arsenide (GaAs), Gallium phosphide (GaP), Indium phosphide (InP), Silicon (Si), Silicon carbide (SiC), or Aluminium oxide ($Al_2O_3$)(Sapphire) etc. And desired materials of the grown thin film are usually compound semiconductors of group III-V or II-VI such as Gallium arsenide (GaAs), Aluminium gallium arsenide (AlGaAs), Aluminium gallium indium phosphide (AlGaInP), or Indium gallium nitride (InGaN) etc. Generally, the thin film made of the above semiconductors by deposition is applied to photoelectric elements such as light emitting diode (LED) etc.

However, through MOCVD method, it is difficult to control a thickness and manufacturing quality of the thin film. Moreover, instead of a small-sized thin film of GaN, the thin film of GaN formed by the above MOCVD method is in a large size. Thus, when the large-sized thin film of GaN is utilized to form photoelectric elements, light emitted by the photoelectric elements is liable to have a broad range in wavelength, which causes low luminous intensity.

Another conventional manufacturing method for GaN structure is molecular beam epitaxy, MBE. Apparatus of MBE includes a chamber with ultra-high vacuum, a substrate received in the chamber, a plurality of crucibles, and a gas source, with both of the crucibles and gas source communicating with the chamber. At least one kind of materials for deposition such as a metal element, Gallium (Ga) is put inside the crucibles and then is heated and vaporized to a vapor phase to be sucked into the chamber. On the other hand, gas exhausted from the gas source such as nitrogen ($N_2$) will be excited to a plasma state by illumination of an energy device and flow into the chamber. Hence, the Ga vapor and the plasma $N_2$ can mix together and react to dispose GaN on the substrate.

Taiwan Patent Publication No. 200420492 entitled "III-N NANOSTRUCTURE AND FABRICATION METHOD THEREOF" illustrates an example for using a conventional MBE method to grow GaN structure. A substrate selected from Aluminium oxide ($Al_2O_3$), silicon (Si), Gallium arsenide (GaAs), Zinc oxide (ZnO) or glass is used to grow GaN with temperature 500 to 1000° C. A hexagonal nanopillar structure, which has a flat top surface can be applied to nano light emitting diode (nano-LED), nano laser diode (nano-LD), or nano field effect transistor (nano-FET).

However, due to difference of lattice sizes between GaN and material of the substrate such as $Al_2O_3$ or Si, dislocation or defect will be happened easily in initial grown structure of GaN on the substrate. For example, there is a difference around 14% between GaN and $Al_2O_3$, and around 20% between Si and GaN. Moreover, if the nanopillar of GaN formed by MBE is applied to luminous elements, a connecting portion for connecting with an electrode has to be made on the top of the GaN nanopillar. However, the diameter of the top of the GaN nanopillar is smaller than 1 μm, and thus difficulty in arranging the connecting portion on such small area is high.

Taiwan Patent No. 1300632 entitled "GROUP-III NITRIDE VERTICAL-RODS SUBSTRATE" discloses another example for using the conventional MBE method to grow GaN structure. A buffer layer of SiN or other group III nitrides is initially formed on substrate of materials such as Si, SiC, or $Al_2O_3$, and then vertical rods of GaN are formed on the buffer layer.

However, if GaN rods as described above are applied to luminous elements, the diameter of the top of each GaN rod is too small to form a connecting portion thereon. Moreover, the additional and needed buffer layer for growing the GaN structure leads to complicate manufacturing processes and time consuming. Hence, there is a need for an improvement over the conventional GaN structure and manufacturing method.

SUMMARY OF THE INVENTION

The primary objective of the present invention is to provide a three-dimensional GaN epitaxial structure with a wider area for an electrode to easily connect, so that it is more suitable to be applied on luminous elements.

To accomplish the above objective, the present invention provides a method for forming a three-dimensional GaN epitaxial structure. The method for forming a three-dimensional GaN epitaxial structure according to the preferred teachings of the present invention comprises a disposing step, in which a substrate of $LiAlO_2$ and a source metal of Ga are disposed inside an ultra-high vacuum chamber. An exposing step is importing N ions in plasma state and generated by a nitrogen source into the chamber. A heating step is heating up the source metal to generate Ga vapor. A growing step is forming a three-dimensional GaN epitaxial structure on the substrate by reaction between the Ga vapor and the plasma state of N ions. During the growing step, temperature of the substrate for forming the three-dimensional GaN epitaxial structure is better limited between 600° C. and 750° C. Besides, a N/Ga flux ratio is preferably between 20 and 40.

According to present invention, a three-dimensional GaN epitaxial structure with hexagonal micropyramid or hexagonal rod having a broadened disk-like surface is formed on the substrate. Therefore, when GaN epitaxial structure is applied to luminous elements, the luminous intensity can be higher and the difficulty for connection between a GaN structure and an electrode can also be reduced.

Further scope of the applicability of the present invention will become apparent from the detailed description given hereinafter. However, it should be understood that the detailed description and specific examples, while indicating preferable embodiments of the invention, are given by illustrations only, since various will become apparent to those skilled in the art from this detailed description.

BRIEF DESCRIPTION OF THE DRAWINGS

The present invention can be fully understood from the detailed description given herein below and the accompanying drawings which are given illustrations only, and thus are not limitative of the present invention, and wherein.

All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions that conform to specify the forces of weight, strength, and similar requirements will likewise be within the skill of the art after the following teachings of the present invention have been read and understood.

Where used in the various figures of the drawings, the same numerals that designate the same or similar parts. Furthermore, when the terms "first", "second", "inner", "end", and similar terms are used herein, it should be understood that these terms have reference only to the structure shown in the drawings as it would appear to a person viewing the drawings and are utilized only to facilitate describing the invention.

DETAILED DESCRIPTION OF THE INVENTION

Figure 1:
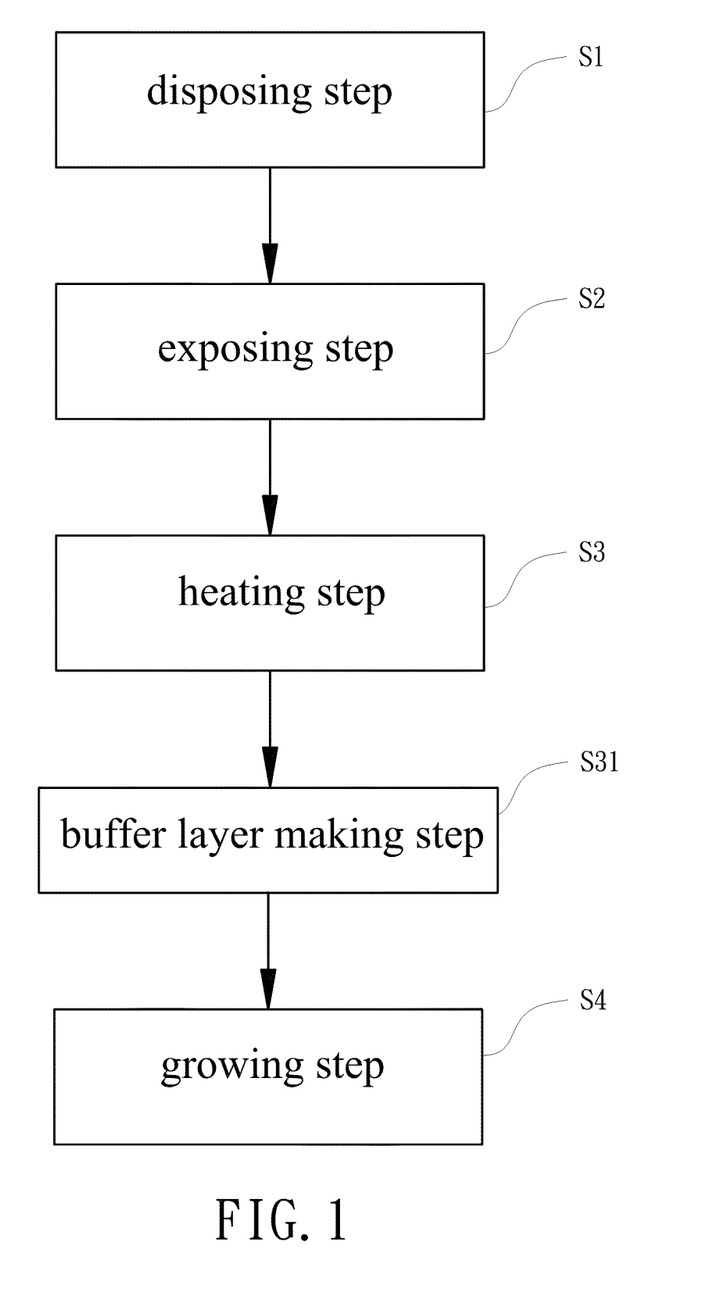
FIG. 1 is a flow chart of manufacturing method for the growing three-dimensional GaN epitaxial structure in accordance with a preferred embodiment of the present invention.
Figure 2:
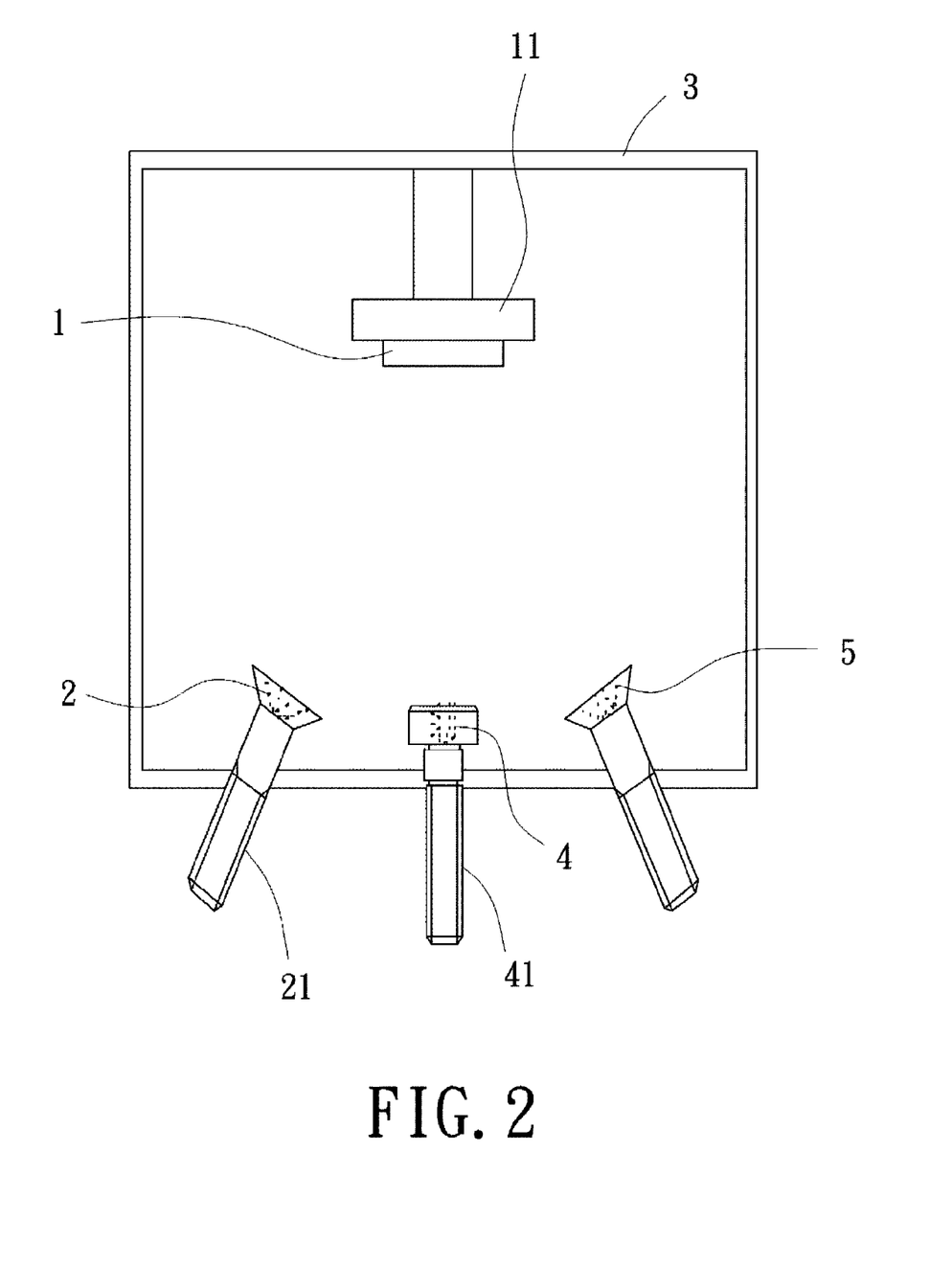
FIG. 2 is a cross sectional view of the apparatus of FIG. 1 in accordance with a preferred embodiment of the present invention.

A manufacturing method for three-dimensional (3D) GaN epitaxial structure of a preferred embodiment according to the preferred teachings of the present invention is shown in FIGS. 1 and 2. The present invention includes a disposing step S1, in which a substrate 1 of $LiAlO_2$ and a source metal 2 of Ga are disposed inside a chamber 3, an exposing step S2 importing N ions generated by a nitrogen source 4 into the chamber 3, a heating step S3 heating up the source metal 2 to generate Ga vapor, a buffer layer making step S31 forming a GaN buffer layer on the surface of the substrate 1, and a growing step S4 forming a three-dimensional GaN epitaxial structure on the substrate 1 by reaction between the Ga vapor and the plasma state of N ions.

In detail, regarding the disposing step S1, the chamber 3 is connected with an air-extracting apparatus to reach an ultra-high vacuum. Preferably, the substrate 1 is cleaned first by acetone, isopropanol, and deionized water etc. in order for removing impurities from surface of the substrate and then put into the chamber 3. Remaining water can be further removed from the surface of the substrate 1 by connecting with and heated by a heating device 11. Because difference of lattice size between $LiAlO_2$ and GaN is just around 0.3 to 1.7%, growing direction of a lattice structure can be aligned in the direction perpendicular to the surface of the substrate 1 and will not be effected by strain or stress. Therefore, atoms can be arranged regularly and avoid defect caused by dislocation. A crucible 21 can be selected to heat up the source metal 2. Besides, the source metal 2 can also be selected from other materials such as In, Mg, Al, or Si so that appropriate amounts of impurities can be doped in the GaN structure. Therefore, according to user's need, p-type semiconductor materials can be obtained by doping Mg in the GaN structure. The n-type semiconductor materials can be obtained by doping Si in the GaN structure.

Referring again to FIGS. 1 and 2, regarding the exposing step S2, in detail, the nitrogen source 4 is connected with the chamber 3 and can be selected from a $N_2$ or $NH_3$ generator. For example, in this embodiment, the nitrogen source 4 is selected from a $N_2$ generator, with $N_2$ generated thereby being excited to plasma state of N ions by radio-frequency plasma (RF plasma) 41 and then delivered to the chamber 3. The surface of the substrate 1 is better to be cleaned first by N ions bombarding for a period of time before next step.

Regarding the heating step S3, by the crucible 21, the source metal 2 inside the chamber 3 can be heated until generating the Ga vapor.

The buffer layer making step S31 forms the GaN buffer layer on the surface of the substrate 1 by reaction between the Ga vapor and plasma state of N ions inside the chamber 3, with the substrate 1 being heated to a first temperature. In detail, preferably, the source metal 2 faces the surface of the substrate 1, so that the Ga vapor can directly float to the surface of the substrate 1 and can react with the plasma state of N ions to transversely form the GaN buffer layer on the surface of the substrate 1. Thus, stability of the 3D GaN epitaxial structure is enhanced.

The growing step S4 forms the 3D GaN epitaxial structure on the substrate 1 by reaction between the Ga vapor and the plasma state of N ions, with the substrate 1 being heated to a second temperature. In detail, the Ga vapor and the plasma state of N ions are reacted to form a self-assembled and 3D GaN epitaxial structure upwards on the surface of the substrate 1. Furthermore, the buffer layer making step S31 can be skipped by directly heating the substrate 1 to the second temperature so as to directly form various shapes of the self-assembled and 3D GaN epitaxial structure upwards on the surface of the substrate 1.

Furthermore, according to the preferred teachings of the present invention, during the growing step S4, temperature of the substrate 1 for forming the three-dimensional GaN epitaxial structure is better limited between 600° C. and 750° C. Besides, a N/Ga flux ratio is preferably between 20 and 40. On one hand, if the temperature is lower than 600° C. or the N/Ga flux ratio is lower than 20, the bonding strength between the Ga vapor and the plasma state of N ions is low, and thus excess Ga atoms will be heaped on the formed GaN epitaxial structure. On the other hand, if the temperature is higher than 750° C. or the N/Ga flux ratio is higher than 40, the amount of N ions will be too much and the amount of Ga atoms is relatively insufficient, so that the surface of the formed GaN epitaxial structure will be rough.

Figure 3:
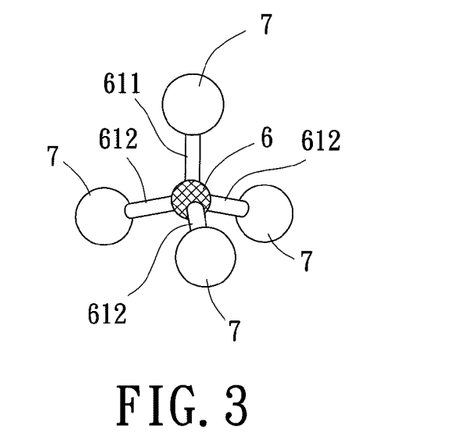
FIG. 3 is a diagram illustrating a basic structure with one N atom and four Ga atoms in accordance with a preferred embodiment of the present invention.
Figure 4:
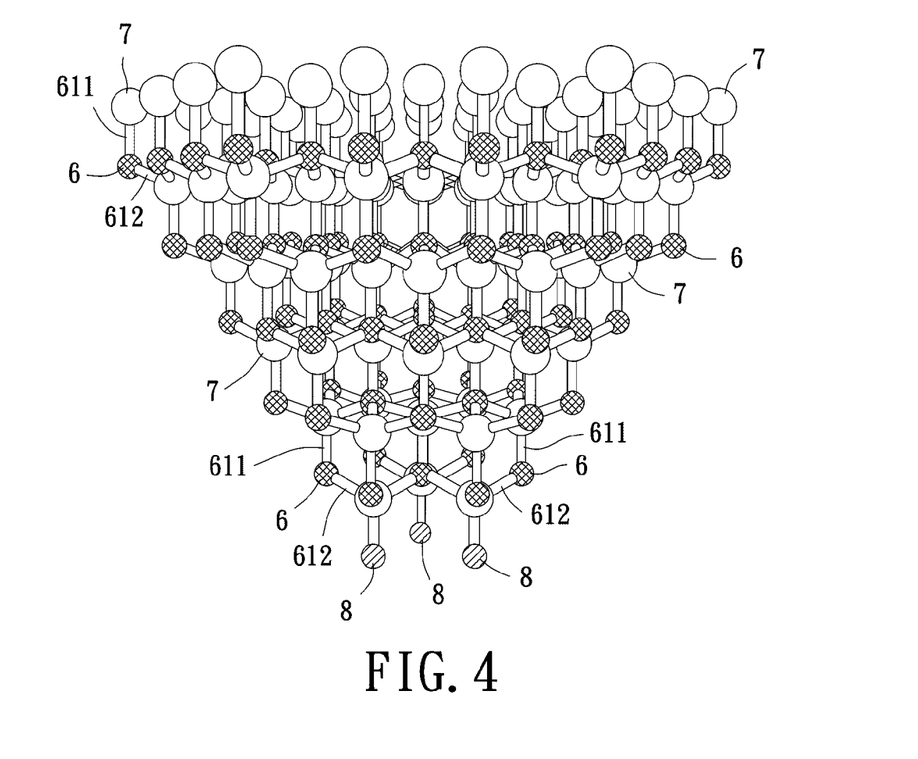
FIG. 4 is a diagram illustrating the awl-shaped disk of the ball-stick model for GaN epilayer in accordance with a preferred embodiment of the present invention.

Referring to FIGS. 3 and 4, a diagram of a basic structure with one N atom and four Ga atoms is illustrated, wherein the N atom is regarded as a center of the basic structure and numbered as "6" while the Ga atoms are numbered as "7." For the following description, a $\bar{\alpha}$ bond between the N atom and one of the Ga atoms, which is located above N atom, is numbered as "611." And, $\bar{\beta}$ bonds between the N atom and the other three Ga atoms are numbered as "612."

Referring to FIG. 4, according to the above definitions, arrangements of the three-dimensional GaN epitaxial structure match formulae (a), (b), (c), and (d) below.

For $L(i,j=4(i-1)+1)$, $$^{i}Ga_j = L(i-1,j-4)A + 3\times(i-1)B + (3\times i)C - [L(i-1,j-4) + 3\times(i-1) + 3\times i]\bar{\alpha} + 3\times[L(i-1,j-4) + 3\times(i-1) + 3\times i]\bar{\beta} \quad (a).$$

For $L(i,j=4(i-1)+2)$, $$^{i}N_j = L(i-1,j-4)A + 3\times(i-1)B + 3\times(i+1)C + [L(i-1,j-4) + 3\times(i-1) + 3\times(i+1)]\bar{\alpha} - 3\times[L(i-1,j-4) + 3\times(i-1) + 3\times(i+1)]\bar{\beta} \quad (b).$$

For $L(i,j=4(i-1)+3)$, $$^{i}Ga_j = L(i-1,j-4)A + 3\times(i-1)B + 3\times(i+1)C - [L(i-1,j-4) + 3\times(i-1) + 3\times(i+1)]\bar{\alpha} + 3\times[L(i-1,j-4) + 3\times(i-1) + 3\times(i+1)]\bar{\beta} \quad (c).$$

For, $L(i,j=4(i-1)+4)$, $$^{i}N_j = L(i-1,j-4)A + (3\times i)B + 3\times(i+1)C + [L(i-1,j-4) + (3\times i) + 3\times(i+1)]\bar{\alpha} - 3\times[L(i-1,j-4) + (3\times i) + 3\times(i+1)]\bar{\beta} \quad (d).$$

Regarding the above formulae (a), (b), (c), and (d), $L(i,j)$ means numbers of atoms at a jth layer in an ith unit cell, with each unit cell including atoms located in adjoining four layers. "A" in the formulae above means numbers of "A-type atoms". The A-type atoms include the N atom providing three $\bar{\beta}$ bonds to bond with three Ga atoms and the Ga atom bonding with the N atom of A-type by a $\bar{\alpha}$ bond. "B" in the formulas above means numbers of "B-type atoms". The B-type atoms include the N atom providing two $\bar{\beta}$ bonds to bond with two Ga atoms and the Ga atom bonding with the N atom of B-type by a $\bar{\alpha}$ bond. "C" in the formulae above means numbers of "C-type atoms," with the C type atoms include the N atom providing only one $\bar{\beta}$ bond to bond with one Ga atom and Ga atoms bonding with the N atoms of C-type by a $\bar{\alpha}$ bond. The "$\bar{\alpha}$" in formulae above means the numbers of the $\bar{\alpha}$ bonds, and The "$\bar{\beta}$" in formulae above means the numbers of the $\bar{\beta}$ bonds.

Referring to FIG. 4 again, the GaN epitaxial structure is formed with a plurality of layers, wherein a bottom layer defined as a $0^{th}$ layer has three O atoms of the substrate 1, with the O atoms being numbered as "8." Atoms in a $1^{st}$ layer are Ga atoms, which is located at a $1^{st}$ unit cell. Namely, for the $1^{st}$ layer (i=1 and j=1), the number of Ga atoms in the $1^{st}$ layer may be obtained through formula (a) as the following:

$$L(1,1) = {}^{1}Ga_1 = 3A - 3\bar{\alpha} + 3\times 3\bar{\beta} = 3.$$

According to formula (a), the number of Ga atoms in the $1^{st}$ layer is 3.

Atoms shown in a $2^{nd}$ layer are N atoms, which is also located at the $1^{st}$ unit cell. Namely, for the $2^{nd}$ layer (i=1 and j=2), the number of atoms in the $2^{nd}$ layer may be obtained through formula (b) as the following:

$$L(1,2) = {}^{1}N_2 = 1A + 3\times 2C + 7\bar{\alpha} - 3\times 7\bar{\beta} = 7.$$

According to formula (b), the number of N atoms in the $2^{nd}$ layer is 7.

Atoms shown in a $3^{rd}$ layer are Ga atoms, which is also located at the $1^{st}$ unit cell. Namely, for the $3^{rd}$ layer (i=1 and j=3), the number of atoms in the $3^{rd}$ layer may be obtained through formula (c) as the following:

$$L(1,3) = {}^{1}Ga_3 = 1A + 3\times 2C - 7\bar{\alpha} + 3\times 7\bar{\beta} = 7$$

According to formula (c), the number of N atoms in the $3^{rd}$ layer is 7.

Atoms shown in a $4^{th}$ layer are N atoms, which is also located at the $1^{st}$ unit cell. Namely, for the $4^{th}$ layer (i=1 and j=4), the number of atoms in the $4^{th}$ layer may be obtained through formula (d) as the following:

$$L(1,4) = {}^{1}N_4 = 3A + 3\times 1B + 3\times 2C + 12\bar{\alpha} - 3\times 12\bar{\beta} = 12$$

According to formula (d), the number of N atoms in the $4^{th}$ layer is 12.

Atoms shown in the $5^{th}$ layer are Ga atoms, which is located at the $2^{nd}$ unit cell. Namely, for the $5^{th}$ layer (i=1 and j=5), the number of atoms in the $5^{th}$ layer may be obtained through formula (a) as the following:

$$L(2,5) = {}^{2}Ga_5 = 3A + 3\times 1B + 3\times 2C - 12\bar{\alpha} + 3\times 12\bar{\beta} = 12$$

According to formula (a), the number of Ga atoms in the $5^{th}$ layer is 12.

Therefore, according to formulae (a) to (d), numbers of atoms in each layer of the 3D GaN epitaxial structure can be identified.

Figure 5:
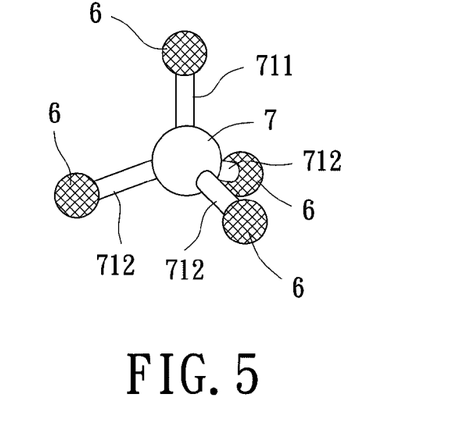
FIG. 5 is a diagram illustrating a basic structure with one Ga atom and four N atoms in accordance with a preferred embodiment of the present invention.

As shown in FIG. 5, Ga atom 7 is defined as a center atom bonding with four N atoms 6. Bonding between Ga atom and one N atom, which located above Ga atom, is called α bond 711. Bondings between Ga atom and three other N atoms are called β bond 712.

Because difference of lattice sizes between the substrate 1 and GaN is small, the 3D GaN epitaxial structure with order can be grown. For example, in this embodiment, a hexagonal micropyramid or hexagonal rod of the 3D GaN epitaxial structure is grown orderly on the substrate 1.

Figure 6:
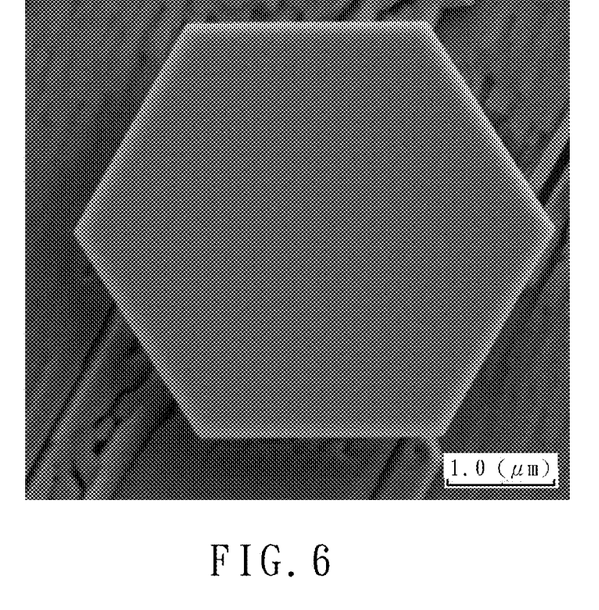
FIG. 6 is a SEM micrographic image of top view of the hexagonal disk of GaN structure in accordance with a preferred embodiment of the present invention.
Figure 7:
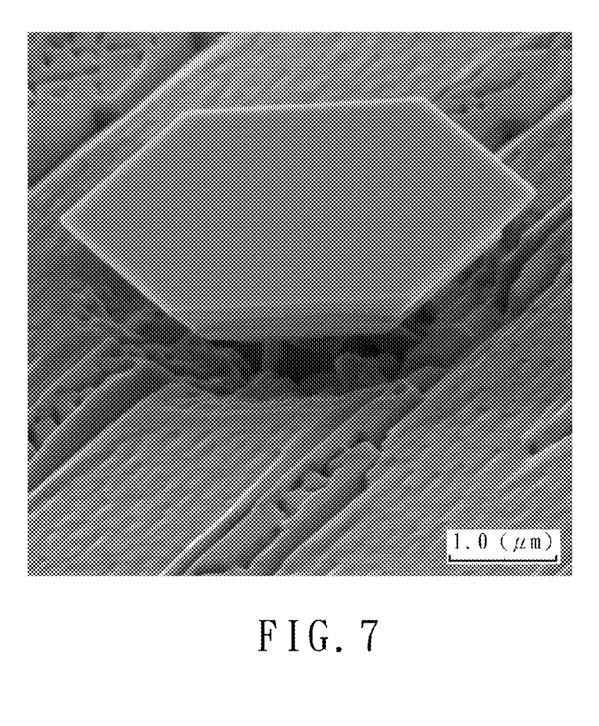
FIG. 7 is a SEM micrographic image of the hexagonal disk of GaN structure in accordance with a preferred embodiment of the present invention.
Figure 8:
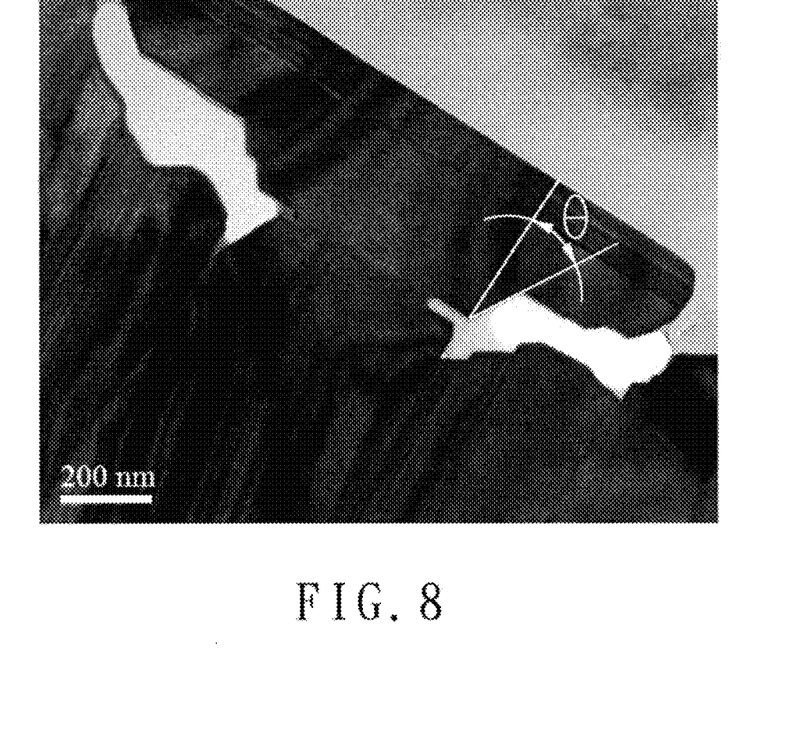
FIG. 8 is an enlarged cross-sectional TEM image of the disk in accordance with a preferred embodiment of the present invention.

FIGS. 6 and 7 show images of the 3D GaN epitaxial structure according to the preferred teachings of the present invention, which are taken by scanning electron microscope (SEM). The 3D GaN epitaxial structure shown in FIGS. 6 and 7 are obtained with the following conditions. In the exposing step S2, the temperature of the substrate 1 is 600°, energy strength of the RF plasma 41 is 500 W, the flow rate of $N_2$ is $8.25\times10^{-6}$ torr, and the process time thereof is 10 minutes. Moreover, the buffer layer making step S31 is omitted while the second temperature of the substrate 1 is 750°, the N/Ga flux ratio is 36, and the growth time is 2 hours for the growing step S4. Specifically, A first end of the 3D GaN epitaxial structure is a taper terminal connecting with substrate 1 and a second end of the 3D GaN epitaxial structure is a broadened free end with a hexagonal disk-like surface. Therefore, the 3D GaN epitaxial structure in a tapered shape is formed on the substrate 1, with a wider area on the top and a narrower area on the bottom, so as to provide easy assembly between an electrode and the wider second end while a design of high luminous intensity and small size is achieved. Referring to FIG. 8, an angle θ between a direction perpendicular to the disk-like surface and a lateral wall adjacent to the rim of the first end is defined, with the angle θ preferably being around 28°, which matches the wurtzite crystal structure of GaN.

Figure 9:
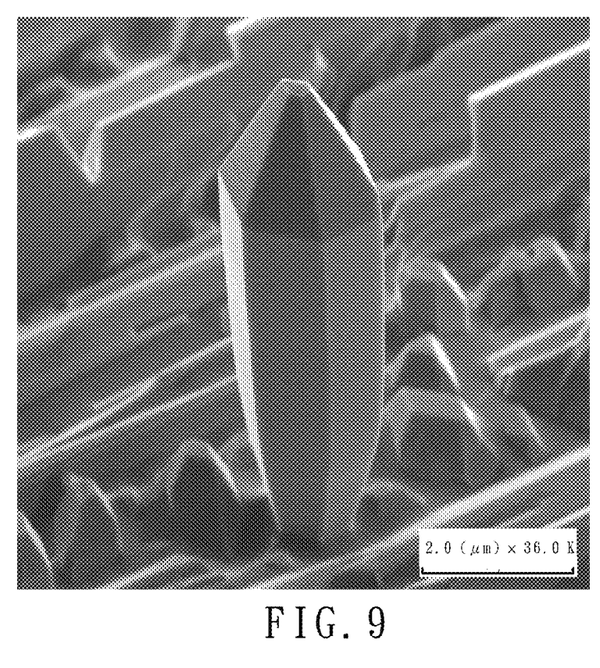
FIG. 9 is a SEM micrographic image with a tilted angle of GaN structure in accordance with a preferred embodiment of the present invention.
Figure 10:
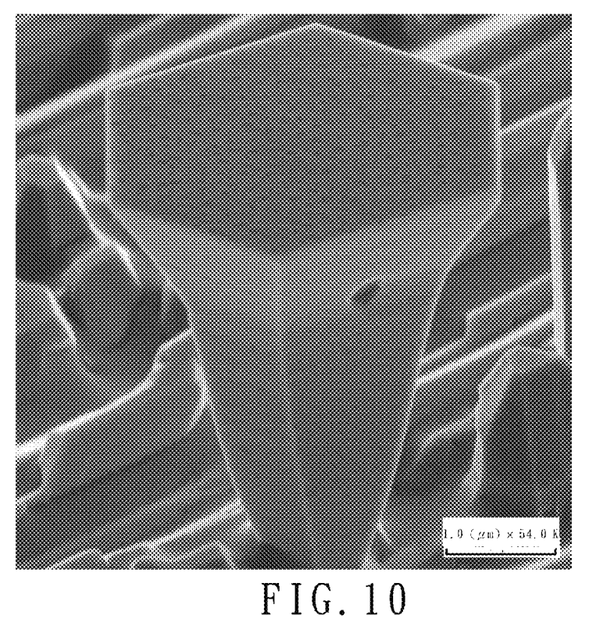
FIG. 10 is a SEM micrographic image of GaN structure in accordance with a preferred embodiment of the present invention.

The images of scanning electron microscope (SEM) as shown in FIGS. 9 and 10 are obtained from the 3D GaN epitaxial structure of the present invention with the following conditions. In the exposing step S2, the temperature of substrate 1 is 600° C., energy strength of the RF plasma 41 is 500 W, the flow rate of $N_2$ is $8.25\times10^{-6}$ torr, and the process time thereof is 10 minutes. Moreover, the buffer layer making step S31 is also omitted while, for the growing step S4, the second temperature of the substrate 1 is controlled at 700° C. with the N/Ga flux ratio being 36 and the process time being 2 hours. Specifically, there may be a hexagonal micropyramid formed on top of a hexagonal rod of 3D GaN epitaxial structure as shown on FIG. 9, or a broadened disk-like surface formed thereon as shown on FIG. 10. Therefore, in comparison with conventional GaN nanopillar structure, with the broadened disk-like surface, the difficulty for connection between the 3D GaN epitaxial structure of the present invention and an electrode can also be reduced.

Besides, the 3D GaN epitaxial structure of the present invention can also obtained with the following conditions. In the exposing step S2, the temperature of the substrate 1 is 600° C., energy strength of the RF plasma 41 is 500 W, the flow rate of $N_2$ is $8.25 \times 10^{-6}$ torr, and the process time thereof is 10 minutes. And, the buffer layer making step S31 is omitted while, for the growing step S4, the second temperature of the substrate 1 is 700° C., the N/Ga flux ratio is 23, and the process time is 2 hours.

Figure 11:
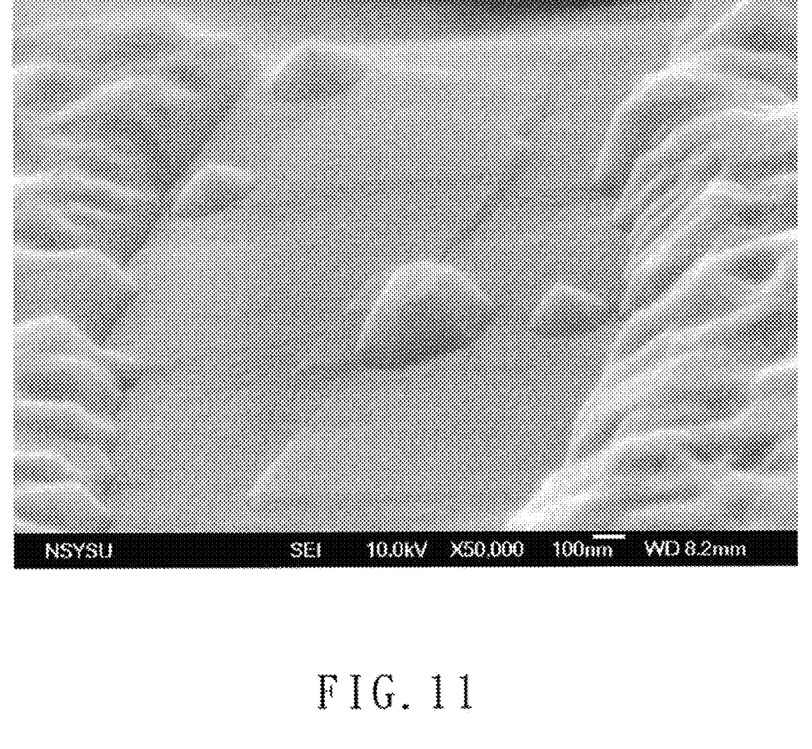
FIG. 11 is a SEM micrographic image of GaN structure in accordance with a preferred embodiment of the present invention.

Alternatively, the 3D GaN epitaxial structure of the preferred teachings of the present invention shown by images of scanning electron microscope (SEM) in FIG. 11 is a structure with a buffer layer, which is obtained with the following conditions. In the exposing step S2, the temperature of the substrate 1 is maintained at 500° C. for 10 minutes. After completing the heating step S3, the buffer layer making step S31 is proceeded for 3 minutes with the first temperature of the substrate being kept at 500° C. Following, the growing step S4 is proceeded for growing 3D GaN epitaxial structure with the second temperature of the substrate being 600° C. and the N/Ga flux ratio being 36.76. A right hexagonal micropyramid of the 3D GaN epitaxial structure can be formed on the buffer layer with a tapered end of the right hexagonal micropyramid away from the substrate 1.

By using the enhanced MBE method of the present invention, the self-assembled GaN structure with an well-ordered arrangement of atoms such as hexagonal micropyramid or hexagonal rod with the broadened free end can be formed on the substrate 1. The GaN structure of the preferred embodiment according to the preferred teachings of the present invention can be applied to the luminous members. Due to quantum limitation effect, a single wavelength of light can be generated to enhance luminous strength and the difficulty of connection with the electrode can be reduced.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A manufacturing method for three-dimensional GaN epitaxial structure comprising:
   a disposing step, in which a substrate of $LiAlO_2$ and a source metal of Ga are disposed inside a vacuum chamber;
   an exposing step of importing N ions in plasma state and generated by a nitrogen source into the chamber;
   a heating step of heating up the source metal to generate Ga vapor; and
   a growing step of forming a three-dimensional GaN epitaxial structure on the substrate by reaction between the Ga vapor and the plasma state of N ions,
   wherein a temperature of the substrate for forming the three-dimensional GaN epitaxial structure is higher than 700° C. and lower than 750° C., and a N/Ga flux ratio is 36, with a flow rate of $N_2$ being $8.25 \times 10^{-6}$ torr, and
   wherein a first end of the three-dimensional GaN epitaxial structure is a taper terminal connecting with the substrate and a second end of the three-dimensional GaN epitaxial structure is a broadened free end with a hexagonal disk-like surface.

2. The manufacturing method for three-dimensional GaN epitaxial structure as defined in claim 1, wherein, a buffer layer making step is proceeded after the heating step and before the growing step, with the GaN buffer layer on the surface of the substrate formed by reaction between the Ga vapor and plasma state of N ions inside the chamber in the buffer layer making step.

3. The manufacturing method for three-dimensional GaN epitaxial structure as defined in claim 1, wherein the nitrogen source is a $N_2$ generator or a $NH_3$ generator.

4. The manufacturing method for three-dimensional GaN epitaxial structure as defined in claim 1, wherein the substrate is cleaned before disposing the substrate of $LiAlO_2$ into the chamber.

5. The manufacturing method for three-dimensional GaN epitaxial structure as defined in claim 4, wherein the substrate is cleaned by acetone, isopropanol, and deionized water in order.

6. The manufacturing method for three-dimensional GaN epitaxial structure as defined in claim 1, wherein the three-dimensional GaN epitaxial structure is in a shape of a hexagonal micropyramid.

7. The manufacturing method for three-dimensional GaN epitaxial structure as defined in claim 6, wherein an angle between a direction perpendicular to a disk-like surface and a lateral wall adjacent to a rim of the first end is substantially 28°.

8. The manufacturing method for three-dimensional GaN epitaxial structure as defined in claim 2, wherein a hexagonal micropyramid of the three-dimensional GaN epitaxial structure is formed on the buffer layer with a tapered end away from the substrate.

* * * * *